United States Patent [19]
Ling et al.

[11] Patent Number: 5,999,443
[45] Date of Patent: Dec. 7, 1999

[54] LOW-VOLTAGE TRIPLE-WELL NON-VOLATILE SEMICONDUCTOR MEMORY

[75] Inventors: Chen Ling, Sunnyvale, Calif.; Siu-han Liao, Hsinchu, Taiwan

[73] Assignee: Holtek Semiconductor Inc., Hsinchu, Taiwan

[21] Appl. No.: 09/059,907

[22] Filed: Apr. 13, 1998

Related U.S. Application Data

[63] Continuation-in-part of application No. 08/806,042, Feb. 1, 1997.

[51] Int. Cl.⁶ .................................................... G11C 16/04
[52] U.S. Cl. ................................. 365/185.01; 365/185.05
[58] Field of Search ......................... 365/185.01, 185.05, 365/185.1, 185.11, 185.26

[56] References Cited

U.S. PATENT DOCUMENTS 5,029,139   7/1991   Paterson ................................. 365/218
5,691,938   11/1997  Yiu et al. ........................... 365/185.11

*Primary Examiner*—Huan Hoang
*Assistant Examiner*—Anh Phung
*Attorney, Agent, or Firm*—W. Wayne Liauh

[57] ABSTRACT

A new structure of a triple-well non-volatile semiconductor memory cell array and a method of fabricating the memory arrays are described. The circuit layout of the memory array not only includes the conventional floating gates, control gates, cell sources and cell drains, but also adds the local source regions to increase the coupling ratio. Besides, the new design can reduce the number of contact windows, further increasing the packing density of the memory array. The key point of the method is the triple-well formation inside the silicon substrate that lowers the operational voltage of periphery circuit. Furthermore, there are two additional isolation regions between two adjacent metal lines, which can minimize the possibility of cross talk due to shirking spacing.

4 Claims, 11 Drawing Sheets

|  |  | Program | Erase | Read |
|---|---|---|---|---|
| Word Line | Selected | −HV | +HV | +LV |
|  | Unselected | +LV | GND | GND |
| Local Bit Line | Selected | +LV | Floating | GND |
|  | Unselected | GND | Floating |  |
| Local Source Line |  | Floating | Floating | GND |
| P−well |  | GND | −HV | GND |
| N−well |  | GND | GND | GND |

FIG. 11

LOW-VOLTAGE TRIPLE-WELL NON-VOLATILE SEMICONDUCTOR MEMORY

This is a continuation-in-part application of application Ser. No. 08/806,042 filed Feb. 1, 1997.

BACKGROUND OF THE INVENTION

(1) Field of the Invention

The invention relates to a method of fabricating non-volatile semiconductor memory devices, and more particularly to a memory device employing local sources having improved coupling ratio.

(2) Description of the Prior Art

The trend of recent semiconductor device developing is that high density non-volatile memory has been expected to replace some part of the huge external storage device market of computers, because of its easy to access and low power dissipation.

Please refer now to FIG. 1, there is shown a cross sectional view of the conventional stack non-volatile memory array cell. A tunnel oxide 2 and a first polysilicon 3A layers are grown on a semiconductor substrate 1. The tunnel oxide layer and the first polysilicon layers are patterned by the conventional lithography and plasma-etching techniques to form the floating gates. A first dielectric 4 and a second polysilicon 5A layers are then deposited overlaying the floating gates. The first dielectric layer is typically made of oxide/nitride/oxide (ONO) sandwich structure. Thereafter, the control gates are patterned.

Next, source 6 and drain 7 regions are formed by ion implanting dopants into the semiconductor substrate which is not covered by the gates. A second dielectric layer 8 (usually made of nitride or oxide) is deposited on the entire substrate surface. Finally, contact windows 9 are opened by lithography and plasma-etching techniques again. The basic structure of a non-volatile memory cell is completed.

Referring now to FIG. 2, there is shown the cell layout corresponding to FIG. 1. The areas marked 10 are the isolation regions.

According to the description above, there must be a contact window for every two cells that limits the packing density of the memory array. Besides, the silicon substrate which is not covered by the first polysilicon (S area of FIG. 2) has great possibilities to be undercut during the self-aligned etching process which affects the resistance values of the source lines. Furthermore, the distance between two adjacent metal lines is too close when cell size continuously shirking that creates cross talk problem. All these drawbacks degrade the performance of the non-volatile memory arrays. Therefore, the present invention provides a new design approach which reduces the cell area compared with the conventional cell without suffering the above problems.

SUMMARY OF THE INVENTION

It is the primary object of the present invention to provide a method of fabricating the non-volatile semiconductor memory array having local sources which are parallel with local bitlines to improve coupling ratio.

It is another object of the present invention is to provide a novel design of the non-volatile semiconductor memory cell which can reduce the cell area and increase the packing density.

It is a further object of the present invention is to provide a low operation voltage non-volatile memory array which is portable.

It is still a further object of the present invention to provide an additional isolation region between two adjacent metal lines of the nonvolatile memory cell that can improve the reliability of the device.

In accordance to these objects of this invention, a new method of fabricating non-volatile semiconductor memory array with high coupling ratio is achieved. The design feature of the non-volatile semiconductor memory array according to the present invention is the triple-well formation in the silicon substrate that lowers the operational voltage of periphery circuit.

First, an N-well is formed in the P-type silicon substrate, followed by the formation of a P-well that is so-called triple-well. Next, an oxide and a nitride layers are grown on the surface of the silicon substrate. Then, the active device area and isolation region are defined by the conventional lithography and etching techniques. One of the key points of the present invention is to form local sources in the active device area by ion-implantation technique.

Next, a tunnel oxide layer is formed on the surface of the silicon substrate. Then, a first polysilicon layer is deposited, followed by the conventional lithography and plasma etching techniques to define the floating gate pattern. Then, a first dielectric, a metal polycide and a second dielectric layers are sequentially deposited overlaying the floating gate. Thereafter, the control gate pattern is defined by the conventional lithography and plasma etching techniques again. Next, the ion implantation technique is employed to form the cell source and cell drain regions of the non-volatile memory array. A cell source/drain oxide layer is then grown on the silicon substrate surface, followed by the spacer oxide layer deposition. The oxide spacers are formed on the sidewalls of the floating gates by the vertically anisotropically plasma-etching technique. Finally, the local bitlines are formed. The triple-well non-volatile semiconductor memory cell array of the present invention is accomplished.

BRIEF DESCRIPTION OF THE DRAWINGS

In the accompanying drawings forming a material part of this description, there is shown:

FIG. 11 shows the examples of the cell operation conditions obtainable with the preferred embodiments of the present invention.

DESCRIPTION OF THE PREFERRED EMBODIMENTS

Figure 1:
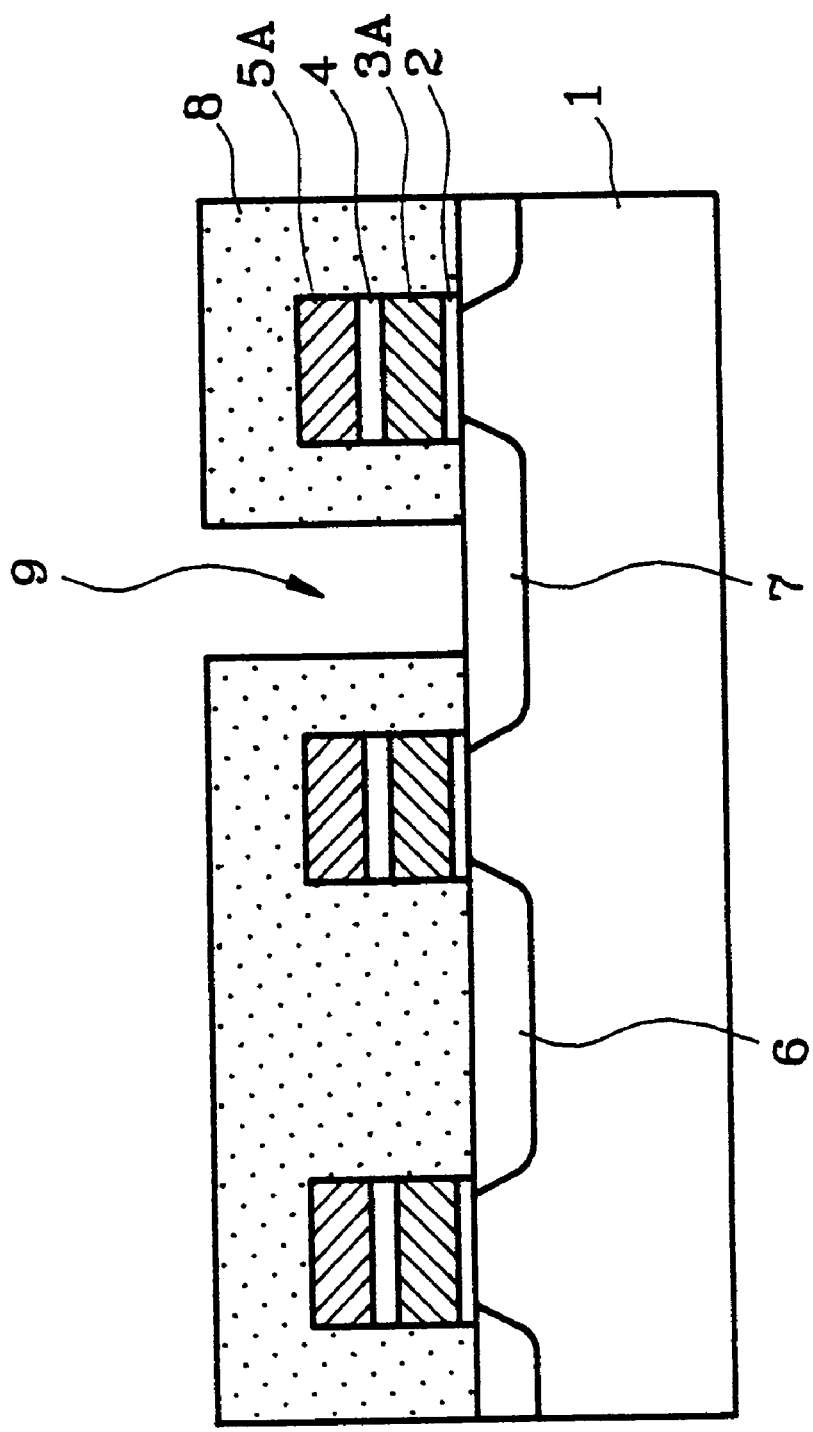
FIG. 1 shows a cross-sectional view of the non-volatile memory cell according to the prior art.
Figure 2:
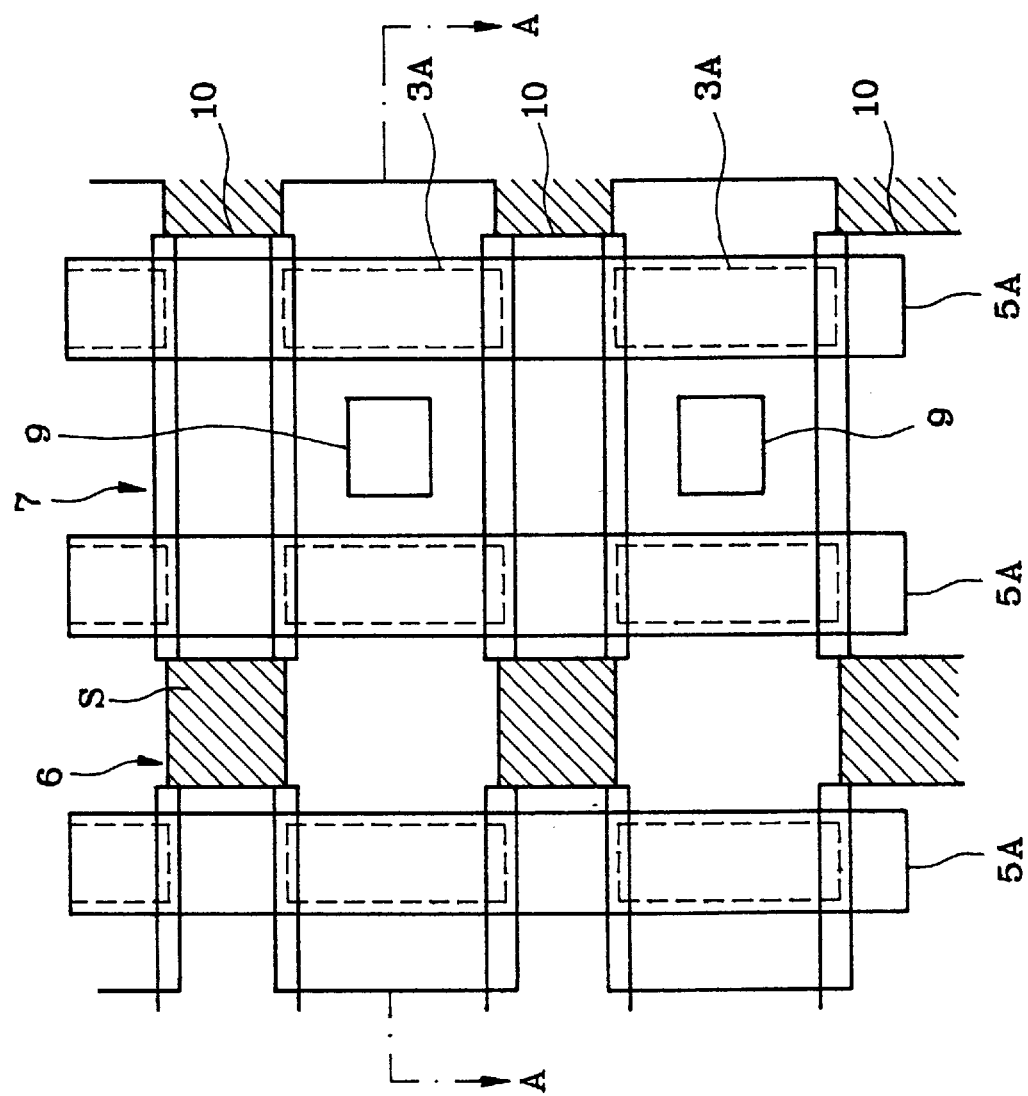
FIG. 2 shows the prior art non-volatile memory cell circuit layout corresponding to FIG. 1.
Figure 3A:
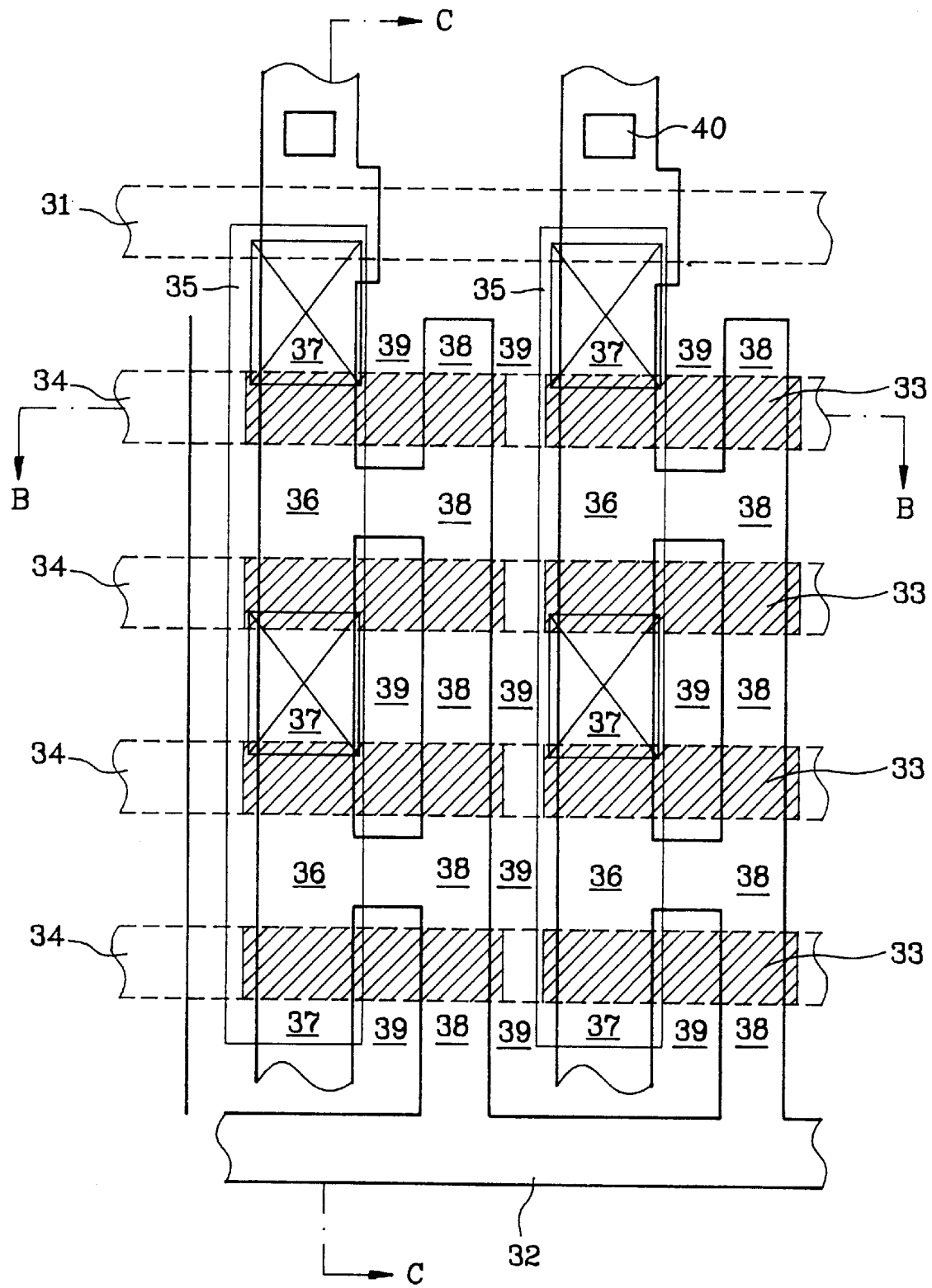
FIG. 3A shows the circuit layout of the triple-well non-volatile memory cell according to the first preferred embodiment of the present invention.

Referring now more particularly to FIG. 3A, there is shown the triple-well non-volatile memory cell circuit layout of the first preferred embodiment of the present invention. The memory cell comprises of:

top select line 31, selecting the cell address of the memory array;

common source line 32;

a plural columns and rows of floating gates 33, located on the surface of a silicon substrate;

a plural rows of control gate 34, continuously located above the floating gates 33;

a plural columns of local bitlines 35, located on the surface of the silicon substrate;

a plural columns of cell sources 36 and cell drains 37, alternatively arranged under the local bitlines 35, and the cell sources and cell drains are separated by the control gates 34;

a plural columns of local sources 38, alternatively arranged with the local bitlines 37 in parallel;

a plural columns of isolation region 39, located between the local bitlines 35 and local sources 38 to isolate the adjacent cell drain 37 and local source 38; and a plurality of contact window 40 which are the place for local bit lines 35 and data lines (not shown) to be electrically connected.

Figure 3B:
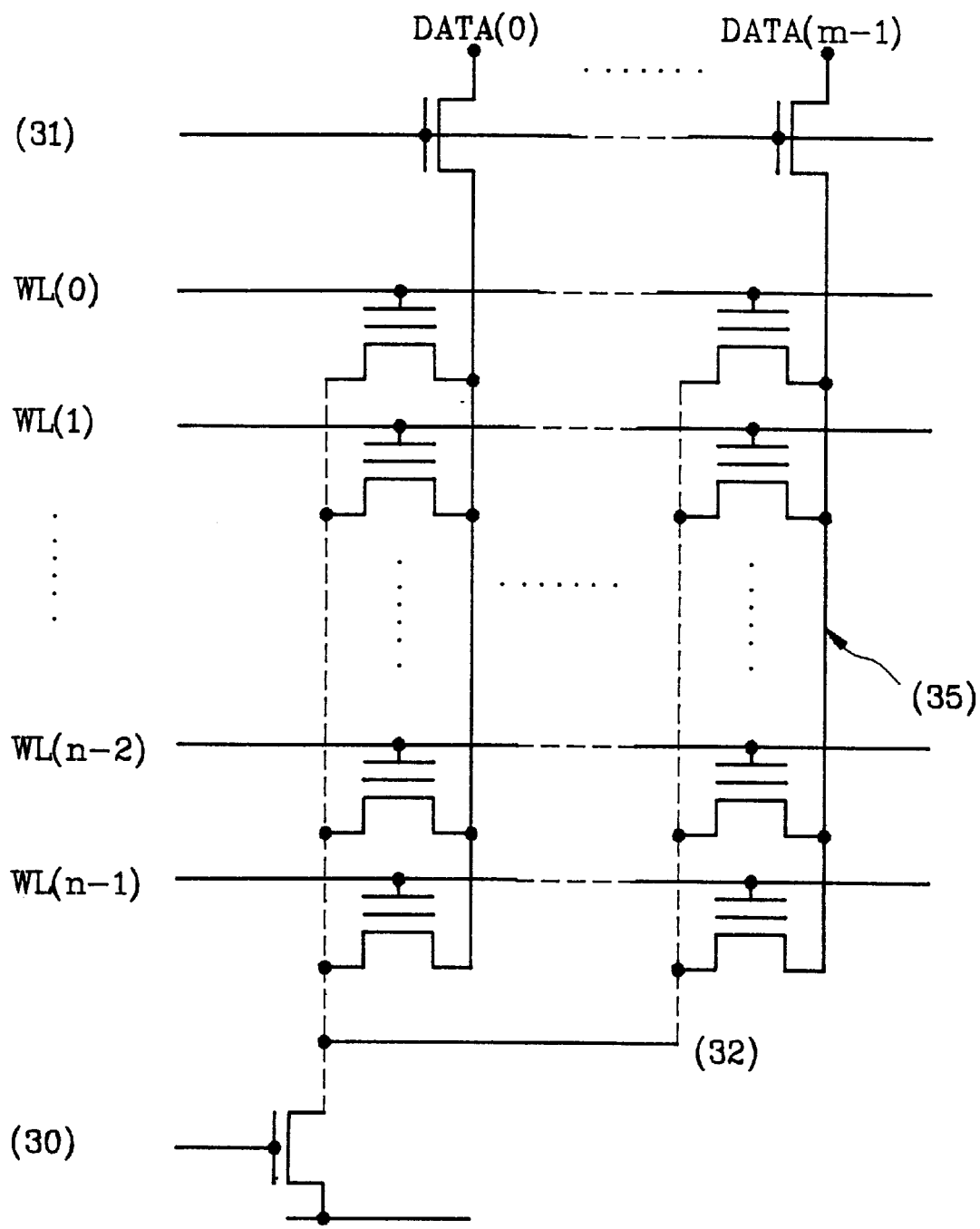
FIG. 3B shows the equivalent circuit diagram corresponding to FIG. 3A.

Referring now to FIG. 3B, there is shown the equivalent circuit diagram corresponding to FIG. 3A. The local source lines are connected to the common source line 32 which is controlled by one bottom select 30 only. The symbols of WL(0), WL(1), ..., WL(n-2), WL(n-1) are representing the wordlines, while the symbols of Data(0), ..., Data(m-1) are representing the datalines. The horizontal wordlines and the vertical datalines cross each other to form the n by m array structure.

Figure 4A:
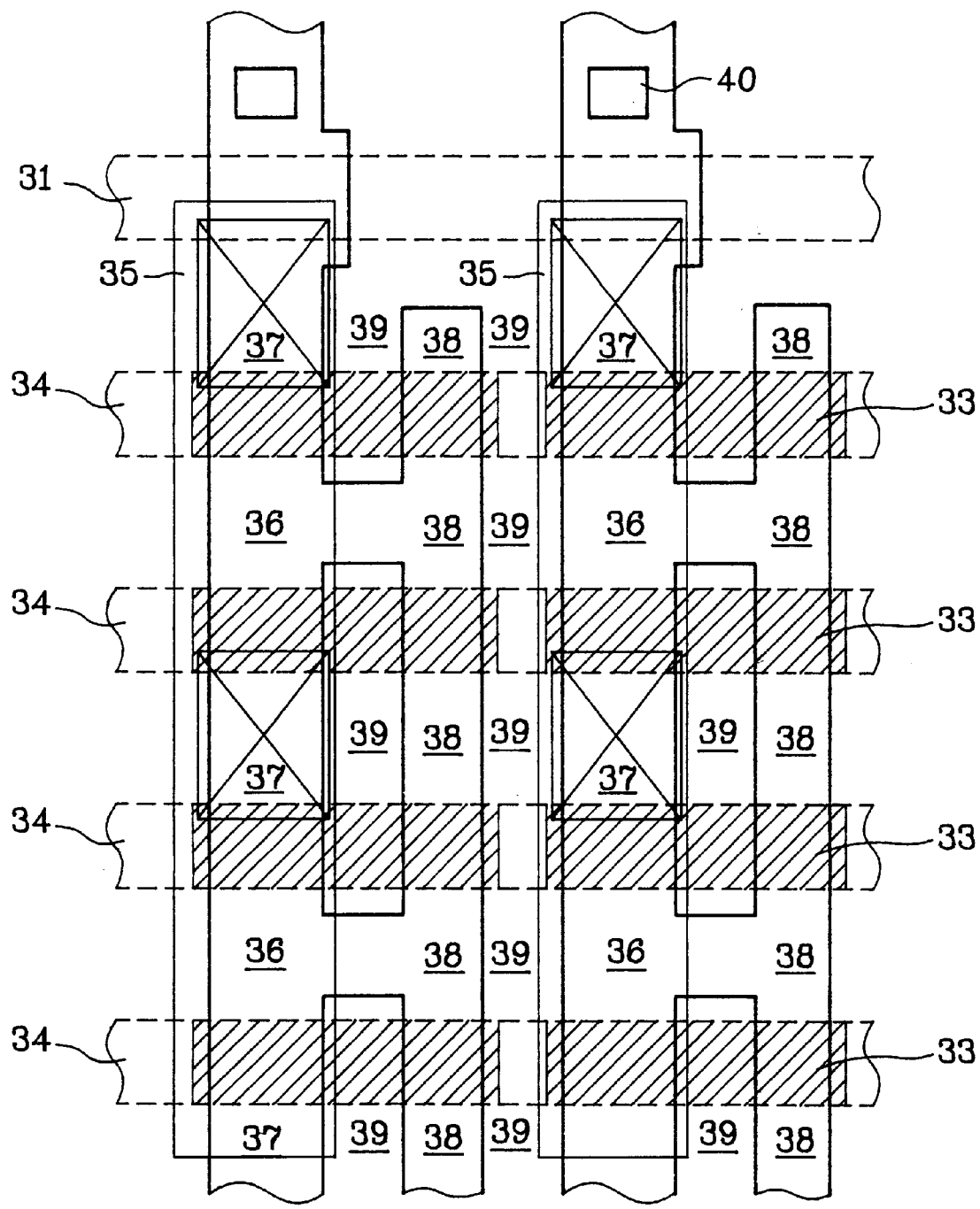
FIG. 4A shows the circuit layout of the triple-well non-volatile memory cell according to the alternating embodiment of the present invention.

Referring now to FIG. 4A, there is shown the triple-well non-volatile memory cell circuit layout of the alternating embodiment of the present invention. The layout is basically the same with the first preferred embodiment of FIG. 3A. The only difference is that each local source line 38 is independently controlled by its own control line.

Figure 4B:
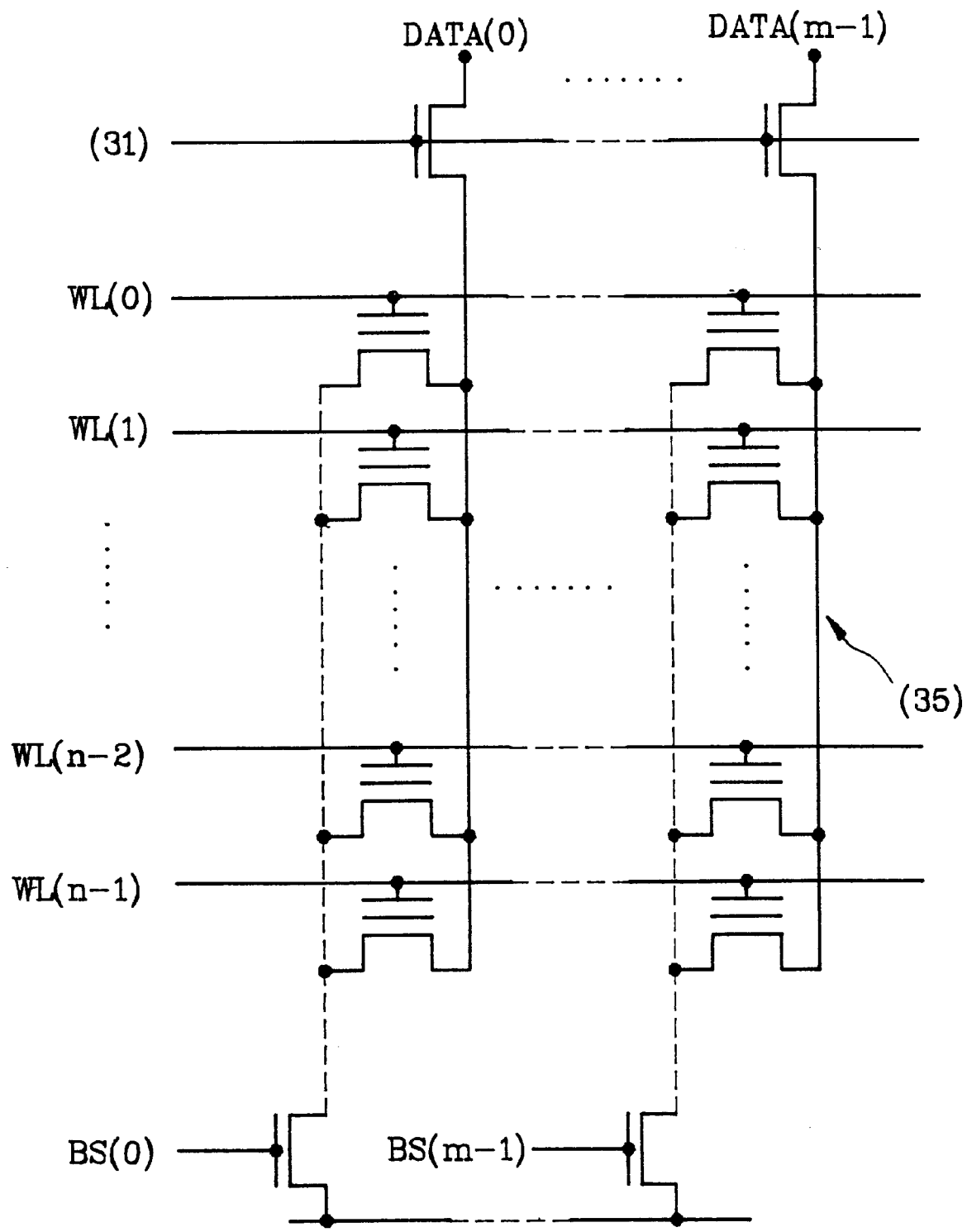
FIG. 4B shows the equivalent circuit diagram corresponding to FIG. 4A.

Referring now to FIG. 4B, there is shown the equivalent circuit diagram corresponding to FIG. 4A. The local source lines are individually controlled by independent control lines of BS(0), ..., BS(m-1).

Referring to FIGS. 5 through 10, the preferred embodiments of the present invention will be described in details. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Figure 5:
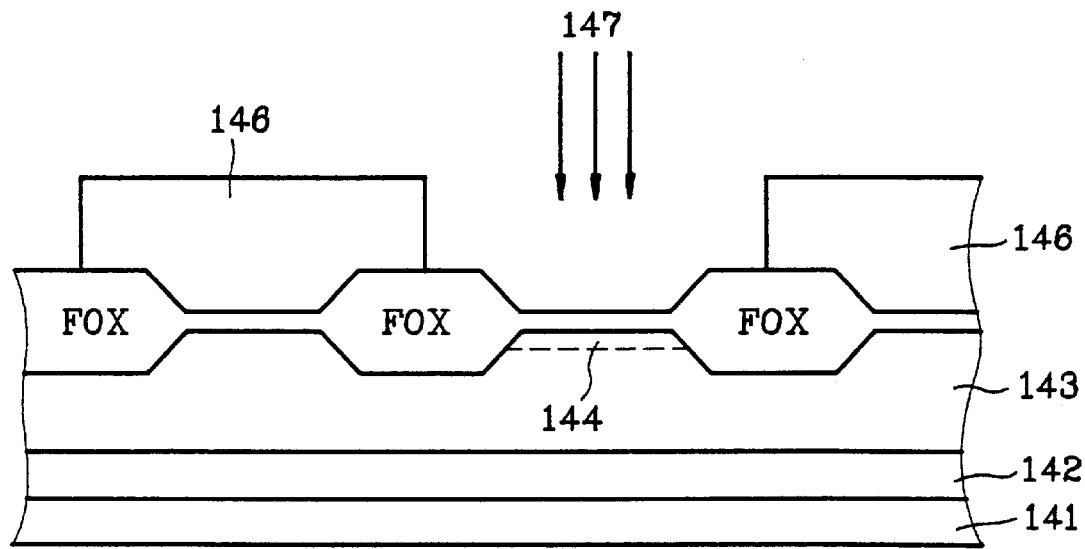
FIGS. 5 through 10 schematically show the cross sectional view of the triple-well non-volatile memory cell according to the preferred embodiments of the present invention.

Referring now to FIG. 5, there is shown a cross sectional view of a partially completed silicon substrate which is cut from the word line direction BB of FIG. 3A. The starting material of the present invention is a monocrystalline P-type silicon substrate 141. First, an N-well 142 is formed in the P-type silicon substrate 141, followed by the formation of a P-well 143. The P-type silicon substrate, N-well and P-well structure is so-called triple-well formation. Next, an oxide and a nitride layers (not shown in the figure) are grown on the surface of the P-well.

The N-well is formed by first ion-implanting N-type impurities which are preferably using phosphorus ($P^{31}$) ions, at an energy of 30 to 100 keV, and a dose between about 5E12 to 1.5E13 $cm^{-2}$, then performing high temperature drive-in. Alternatively, the N-well can be formed by directly ion-implanting high energy phosphorus ($P^{31}$) ions, at an energy of 1.5 to 3 MeV, and a dose between about 5E12 to 1.5E13 $cm^{-2}$ without thermally drive-in. The P-well is also formed by first ion-implanting P-type impurities which are preferably using boron ($B^{11}$) ions, at an energy of 30 to 100 keV, and a dose between about 1E13 to 3E13 $cm^{-2}$, then performing high temperature drive-in. Alternatively, the P-well can be formed by directly ion-implanting high energy boron ($B^{11}$) ions, at an energy of 700 keV to 1.2 MeV, and a dose between about 5E12 to 2E13 $cm^{-2}$ without thermally drive-in.

Still referring to FIG. 5, then, a photoresist layer (not shown) is coated on the silicon substrate 141 and the active device area and isolation region are defined by the conventional lithography and etching techniques. The active device area comprises of:

cell channel;

cell source/drain regions; and local source 144.

The local sources 144 are defined by a photoresist pattern 146 and then formed via ion implantation of arsenic ($As^{75}$) ions 147, at an energy of 20 to 80 keV, and a dose between about 1E15 to 5E15 $cm^{-2}$.

Figure 6:
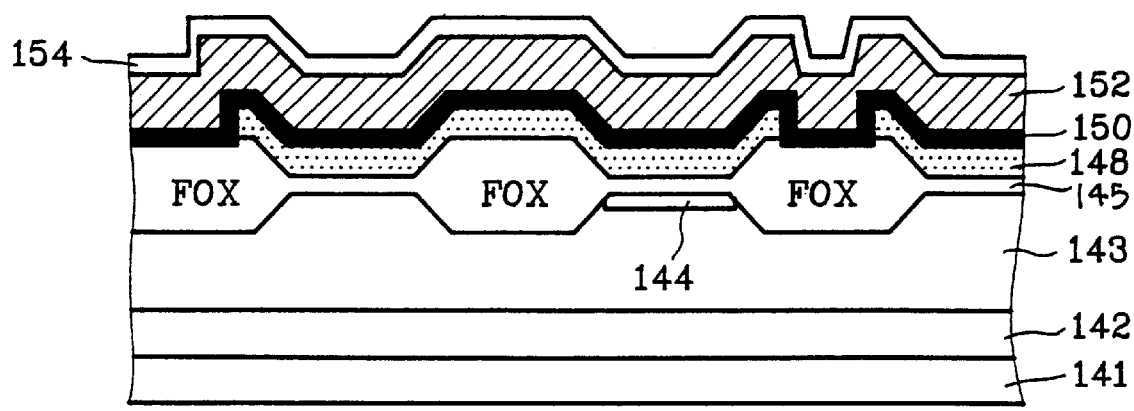

Referring now to FIG. 6, there is shown a cross sectional view of the silicon substrate also from the word line direction BB of FIG. 3A. First, a gate oxide or tunnel oxide layer 145 and a first polysilicon layer 148 are sequentially deposited, followed by the conventional lithography and plasma etching techniques to form the floating gate pattern. Then, a first dielectric 150, a metal polycide 152 and a second dielectric 154 layers are sequentially deposited overlaying the floating gate. Thereafter, the control gate pattern is formed by the conventional lithography and plasma etching techniques again.

The tunnel oxide layer 145 is grown by thermal oxidation method, using steam at a temperature between about 1100 to 1200° C., to a thickness of about 50 to 100 Angstroms. The first polysilicon layer 148 is usually formed by in-situ phosphorus doped LPCVD method under a mixture of (15% $PH_3$+85% $SiH_4$) and (5% $PH_3$+95% $N_2$), the total pressure is about 1 torr, and at the reaction temperature about 550° C. to obtain a thickness of between 500 to 2000 Angstroms. The first polysilicon plasma etching process can use magnetic enhanced reactive ion etching (MERIE), electron cyclotron etching (ECR) or the conventional reactive ion etching (RIE) methods with reactant gases such as $Cl_2$ $SF_6$ and HBr. The first dielectric layer 150 is usually using oxide/nitride/oxide (ONO) triplelayer with the equivalent oxide thickness of about 100 to 300 Angstroms. The polycide layer 152 is usually made of metal polycide materials such as tungsten silicide (WSi) or titanium silicide (TiSi) by low pressure chemical vapor deposition (LPCVD) technique to a thickness of about 1000 to 3000 Angstroms. The second dielectric layer 154 is usually made of oxide or nitride by LPCVD technique also to a thickness of about 1000 to 3000 Angstroms.

Figure 7:
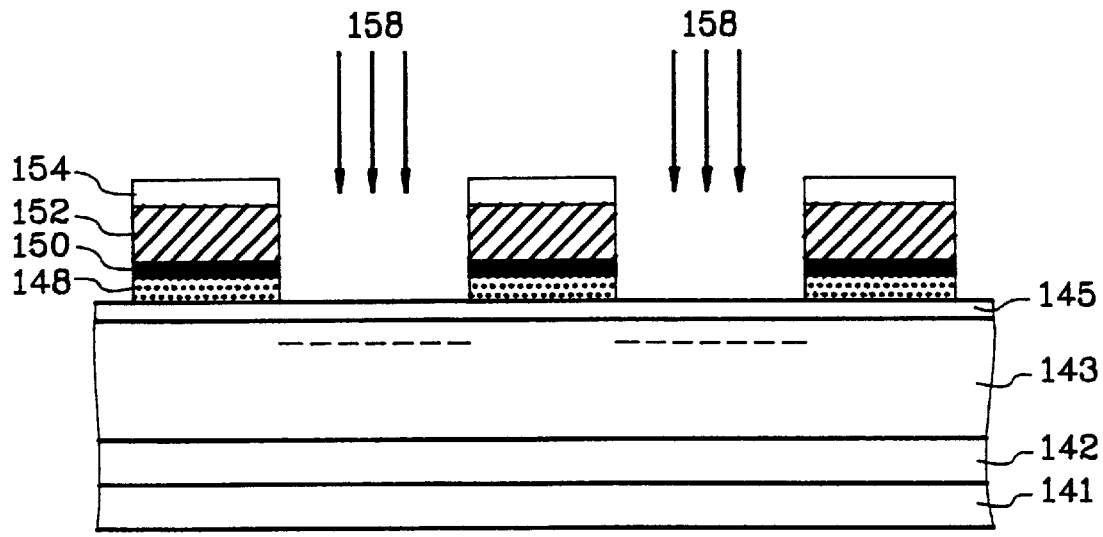

Next, FIGS. 7 through 10 are the cross sectional views of the silicon substrate from the local bitline direction CC of FIG. 3A. Referring now to FIG. 7, the ion implantation technique is employed to form the cell source and cell drain regions of the non-volatile memory array such as flash memory or the electrical programmable read only memory (EPROM) arrays. This is accomplished via ion implantation of arsenic ($As^{75}$) ions, at an energy of 20 to 80 keV, and a dose between about 1E15 to 5E15 $cm^{-2}$.

Figure 8:
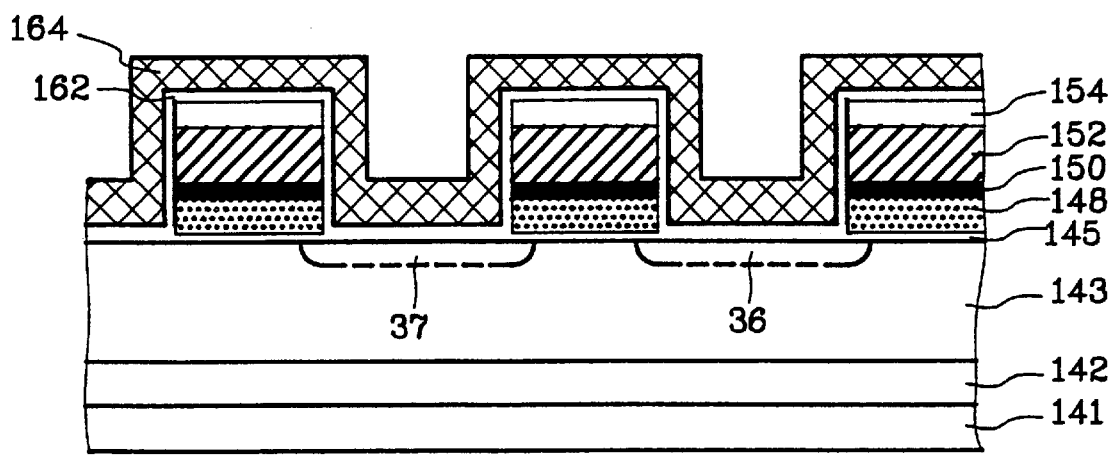

Referring now to FIG. 8, first, a cell source/drain oxide layer 162 is grown on the silicon substrate surface, followed by the spacer oxide layer 164 deposition. The cell source/drain oxidation step is also severed as dopant drive in step, which is performed at a temperature range of about 900 to 1000° C. for about 30 minutes in a nitrogen ambient environment for the purpose of obtaining the desired junction depth. The spacer oxide layer 164 is usually made of silicon dioxide such as TEOS by the LPCVD technique to a thickness of about 2000 to 4000 Angstroms.

Figure 9:
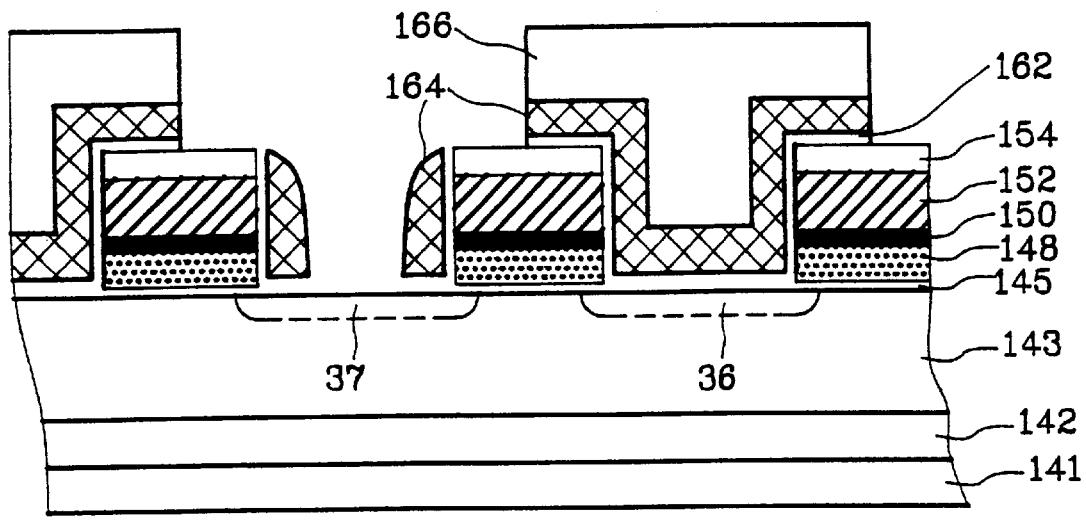

Referring now to FIG. 9, the photoresist pattern 166 is formed by the conventional lithography technique to protect the oxide layer above the cell source 36 region. The oxide spacers 164 are then formed on the sidewalls of the floating gates by the vertically unisotropically plasmaetching technique. The oxide plasma etching process is using the magnetic enhanced reactive ion etching (MERIE) method with reactant gases such as $CF_4$ $CHF_3$ and Ar.

Figure 10:
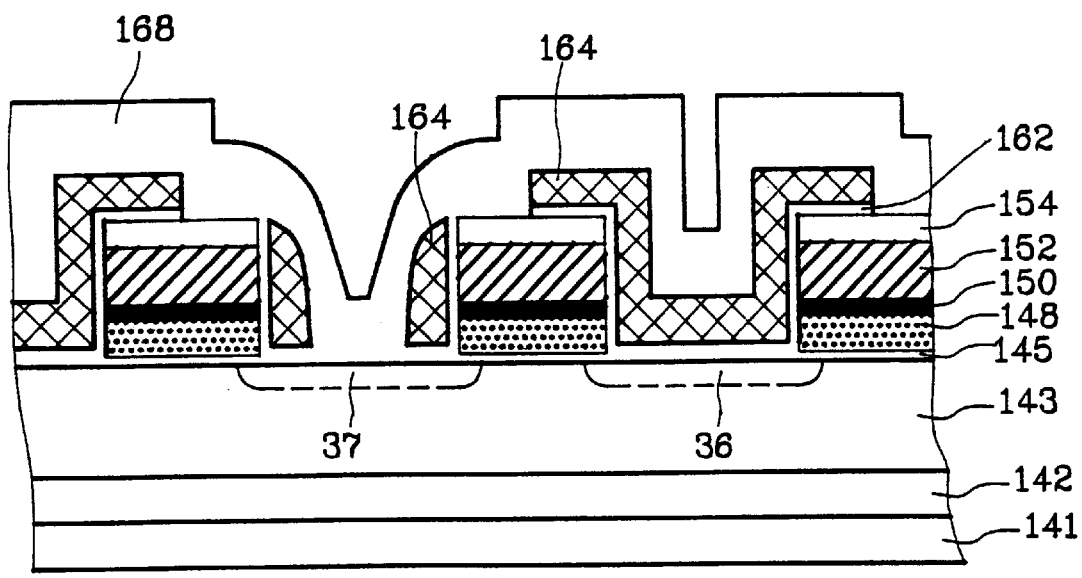

Referring now to FIG. 10, the local bitlines are formed. First, a conducting layer 168 which has a thickness of about 2000 to 4000 Angstroms is deposited over the entire silicon substrate. Then, the local bitline pattern is formed by the conventional lithography and plasma etching techniques. The conducting layer is usually made of low resistivity materials such as polysilicon, tungsten, tungsten silicide (WSi) or titanium silicide (TiSi). The triple-well non-volatile semiconductor memory cell array of the present invention is completed.

Figure 12:
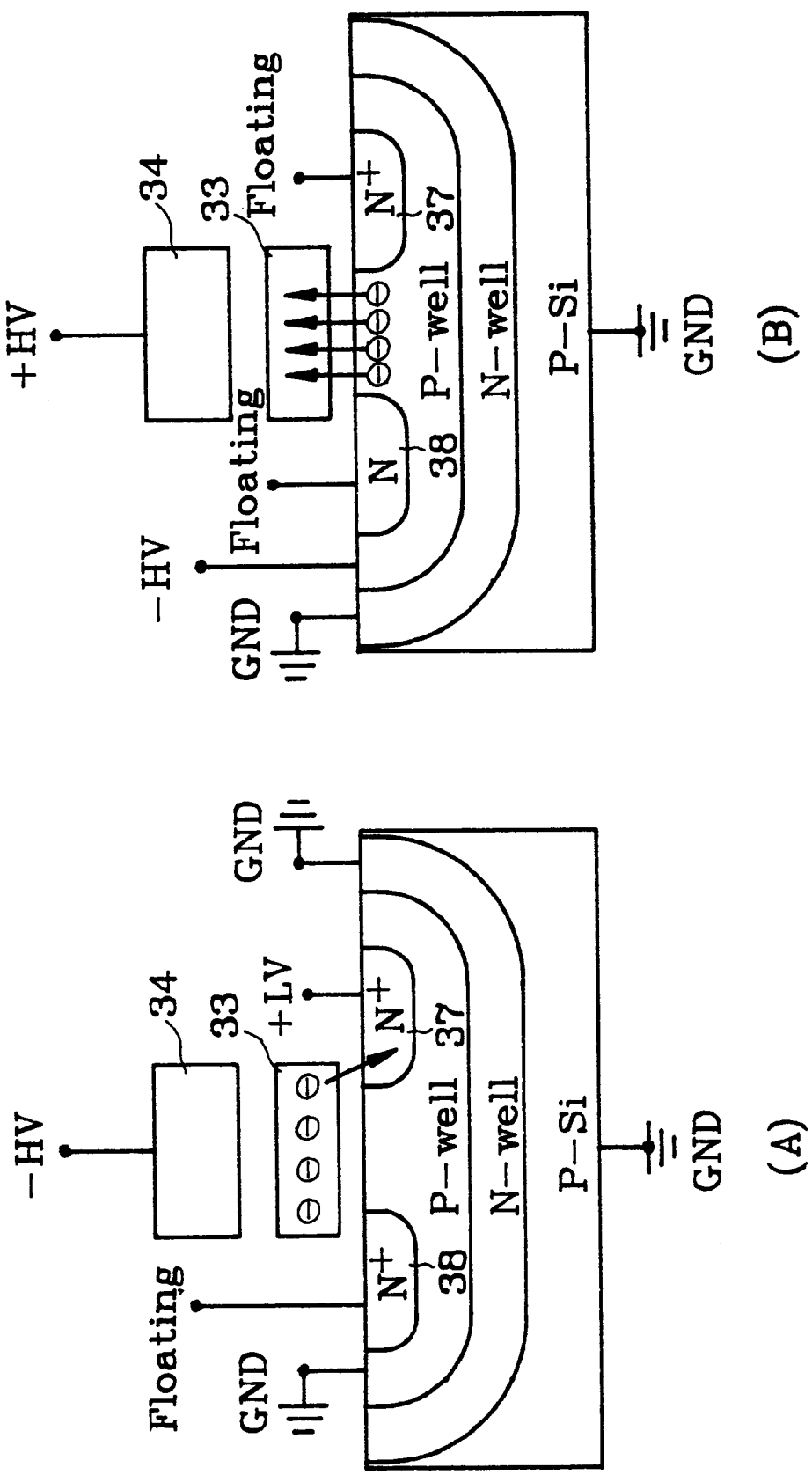
FIG. 12 shows the Program, Erase diagrams and their bias conditions corresponding to FIG. 11.

Finally, referring now to FIG. 11, an example of the cell operation conditions is shown. To program the cell, a pulse of low positive voltage (LV) is applied to the selected local bitline (drain) 37, with the selected wordline (control gate) 34 tied to a high negative voltage (−HV), therefore the electrons are injected from floating gate 33 to local bitline 37 as shown in FIG. 12(*a*). On the other hand, to erase the cell, a pulse of high positive voltage (HV) is applied to the selected wordline (control gate) 34 and a pulse of high negative voltage (−HV) is applied to well regions, with the selected bitline (drain) 37 and local source 38 floating, therefore the electrons are moving from channel to floating gate 33 as shown in FIG. 12(*b*). To read the data stored in the cell, a pulse of low positive voltage (LV) is applied to both the selected wordline (control gate) 34 and local bitline (drain) 37.

While the invention has been particularly shown and described with reference to a preferred embodiment, it will be understood by those skilled in the art that various changes in form and detail may be made therein without departing from the spirit and scope of the present invention.

What we claimed is:

1. A low-voltage non-volatile semiconductor memory cell comprising:

- an arrangement of triple wells provided on the surface of a silicon substrate,
- a plurality of columns and rows of floating gates, located on said triple wells;
- a plurality of rows of control gates, continuously located above said floating gates;
- a plurality of columns of local bitlines, located on the surface of said silicon substrate on top of said control gates;
- a plurality of columns of cell sources and cell drains, alternatively arranged under said local bitline, and said cell sources and cell drains are separated by said control gates;
- a plurality of rows of local sources, alternatively arranged with said local bitlines in parallel; and
- a plurality of columns of isolation regions, isolated between said local lines and said local sources to isolate adjacent said cell drain and local source.

2. The low voltage memory cell of claim 1, wherein said local sources are connected to a common local source.

3. The low voltage memory cell of claim 1, wherein said triple well comprises a P-type substrate, a N-well formed in said P-type silicon substrate, and a P-well formed in said N-well.

4. The low voltage memory cell of claim 1, which further comprises a cell source/drain oxide layer below said local bitlines, wherein said cell source/drain oxide layer contains a plurality of discontinuous line segments and sidewall spacers so as to allow said local bitlines to be in contact with said control gates but not in contact with said floating gates.

\* \* \* \* \*